(12) United States Patent
Nomura et al.

(10) Patent No.: US 12,375,058 B2
(45) Date of Patent: Jul. 29, 2025

(54) VIBRATOR DEVICE, VIBRATOR, AND ELECTRONIC DEVICE

(71) Applicant: Seiko Epson Corporation, Tokyo (JP)

(72) Inventors: Masataka Nomura, Minowa (JP); Norihito Matsukawa, Shimosuwa (JP)

(73) Assignee: SEIKO EPSON CORPORATION (JP)

( * ) Notice: Subject to any disclaimer, the term of this patent is extended or adjusted under 35 U.S.C. 154(b) by 831 days.

(21) Appl. No.: 17/676,319

(22) Filed: Feb. 21, 2022

(65) Prior Publication Data
US 2022/0271732 A1 Aug. 25, 2022

(30) Foreign Application Priority Data
Feb. 22, 2021 (JP) .................. 2021-025980

(51) Int. Cl.
| | | |
|---|---|---|
| *H03H 9/13* | (2006.01) | |
| *H03B 5/32* | (2006.01) | |
| *H03H 9/05* | (2006.01) | |
| *H03H 9/10* | (2006.01) | |
| *H03H 9/19* | (2006.01) | |

(52) U.S. Cl.
CPC .......... *H03H 9/132* (2013.01); *H03H 9/0557* (2013.01); *H03H 9/1021* (2013.01); *H03H 9/19* (2013.01); *H03B 5/32* (2013.01)

(58) Field of Classification Search
CPC .... H03H 9/132; H03H 9/0561; H03H 9/1021; H03H 9/02023; H03H 9/19; H03H 9/0557; H03H 2001/0078; H03B 5/32; H03B 5/368
See application file for complete search history.

(56) References Cited

U.S. PATENT DOCUMENTS

| | | | | |
|---|---|---|---|---|
| 9,774,296 | B2* | 9/2017 | Kishi ................ | H03B 5/32 |
| 2013/0335157 | A1* | 12/2013 | Ishii ................ | H03H 9/1021 |
| | | | | 310/365 |
| 2016/0020748 | A1* | 1/2016 | Obata ............... | H03H 9/02102 |
| | | | | 310/365 |

FOREIGN PATENT DOCUMENTS

| | | | |
|---|---|---|---|
| JP | 2012191560 A | * | 10/2012 |
| JP | 2014-023015 A | | 2/2014 |

* cited by examiner

*Primary Examiner* — J. San Martin
(74) *Attorney, Agent, or Firm* — Harness, Dickey & Pierce, P.L.C.

(57) ABSTRACT

A vibrator device includes a first excitation electrode, a first pad electrode, and a first drawn wiring line that are disposed at a first surface of a vibrator element, a second excitation electrode, a second pad electrode, and a second drawn wiring line that are disposed at a second surface of the vibrator element, and a spiral first electrode pattern disposed at the first surface of the vibrator element. The first excitation electrode and the second excitation electrode are disposed so as to face each other with the vibrator element therebetween. A first central end section of the first electrode pattern is electrically coupled to the second drawn wiring line via a through electrode provided in the vibrator element. A first outer circumferential end section of the first electrode pattern is electrically coupled to the first drawn wiring line. The first drawn wiring line is electrically coupled to at least one of the first excitation electrode and the first pad electrode. The second drawn wiring line is electrically coupled to at least one of the second excitation electrode and the second pad electrode.

11 Claims, 12 Drawing Sheets

VIBRATOR DEVICE, VIBRATOR, AND ELECTRONIC DEVICE

The present application is based on, and claims priority from JP Application Serial Number 2021-025980, filed Feb. 22, 2021, the disclosure of which is hereby incorporated by reference herein in its entirety.

BACKGROUND

1. Technical Field

The present disclosure relates to a vibrator device, a vibrator, and an electronic device.

2. Related Art

There are widely used vibrator devices provided with excitation electrodes on opposite sides of a vibrator element made of a quartz crystal. For example, JP-A-2014-23015 discloses a vibrator device provided with a spiral electrode pattern in addition to excitation electrodes and pad electrodes. The spiral electrode pattern is an inductor provided with one of the pad electrodes at the center thereof. The outer circumferential end of the inductor is electrically coupled to one of the excitation electrodes via a wiring line.

Figure 7:
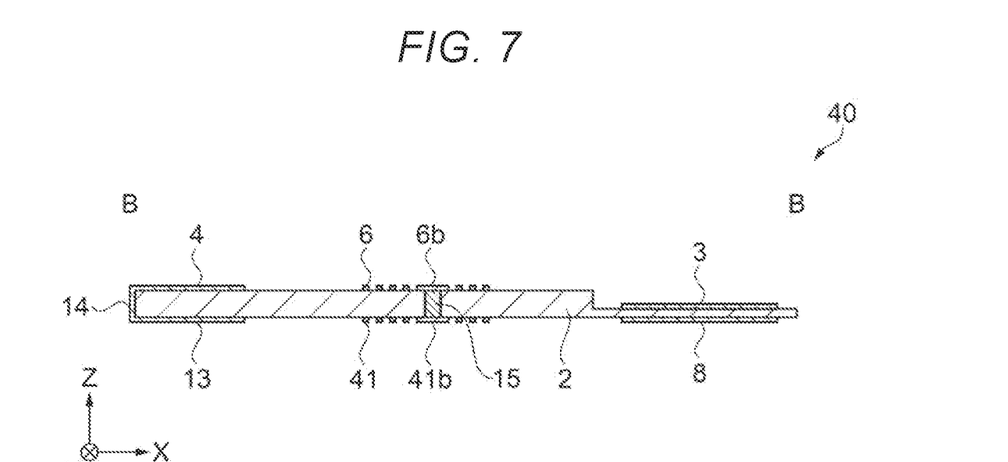
FIG. 7 is a diagrammatic side cross-sectional view showing the configuration of the vibrator device.

In the vibrator device disclosed in JP-A-2014-23015, one end of a bonding wire is coupled to the pad electrode at the center of the inductor, and the electrical coupling is made with the bonding wire crossing the inductor in the plan view, as shown in FIG. 7.

The vibrator device disclosed in JP-A-2014-23015, however, has a possible problem of variation in the oscillation characteristics of the vibrator device. In detail, the magnetic flux generated in the inductor is magnetically coupled to the bonding wire disposed in the vicinity of the inductor, resulting in variation in the inductance value.

SUMMARY

A vibrator device includes a first excitation electrode, a first pad electrode, and a first drawn wiring line that are disposed at one surface of a vibrator element, a second excitation electrode, a second pad electrode, and a second drawn wiring line that are disposed at another surface of the vibrator element, and a spiral first electrode pattern disposed at the one surface of the vibrator element. The first excitation electrode and the second excitation electrode are disposed so as to face each other with the vibrator element therebetween. A central end section of the first electrode pattern is electrically coupled to the second drawn wiring line via a through electrode provided in the vibrator element. An outer circumferential end section of the first electrode pattern is electrically coupled to the first drawn wiring line. The first drawn wiring line is electrically coupled to at least one of the first excitation electrode and the first pad electrode. The second drawn wiring line is electrically coupled to at least one of the second excitation electrode and the second pad electrode.

A vibrator includes the vibrator device described above and a package in which the vibrator device is incorporated.

An electronic device includes the vibrator device described above, a package in which the vibrator device is incorporated, and a drive circuit substrate that supplies the first excitation electrode and the second excitation electrode with a drive voltage.

DESCRIPTION OF EXEMPLARY EMBODIMENTS

First Embodiment

In the present embodiment, a characteristic example of a vibrator device will be described with reference to the drawings. FIG. 2 shows a cross section taken along the line AA in FIG. 1. FIG. 3 shows the vibrator device in FIG. 1 viewed from the other side.

Figure 1:
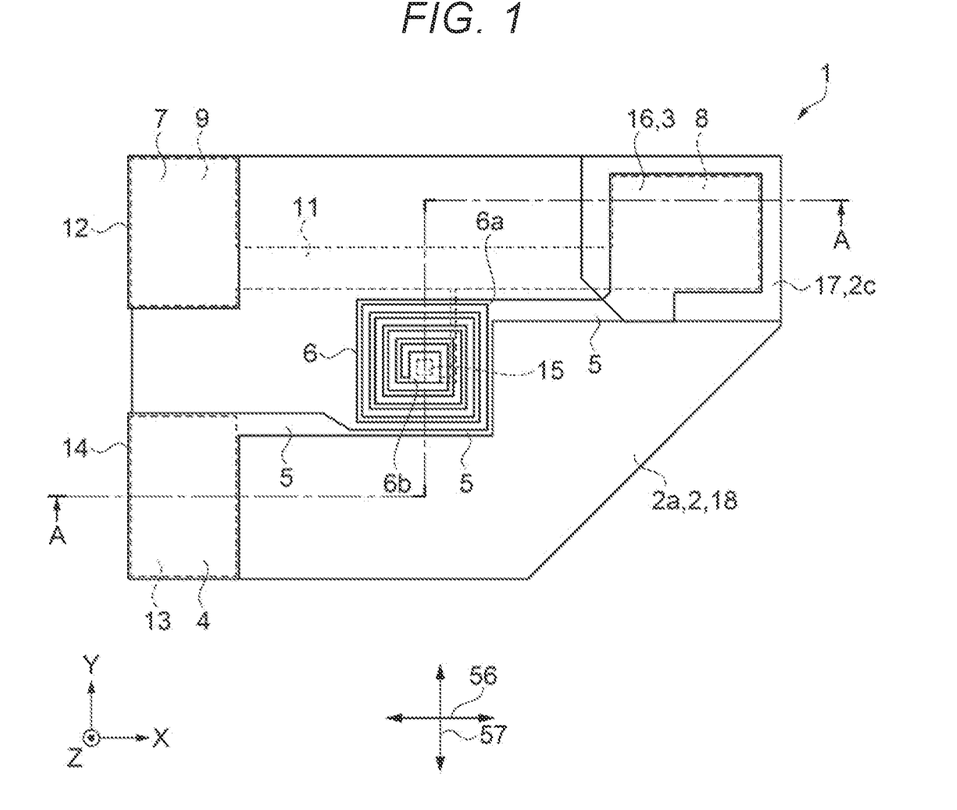
FIG. 1 is a diagrammatic plan view showing the configuration of a vibrator device according to a first embodiment.
Figure 2:
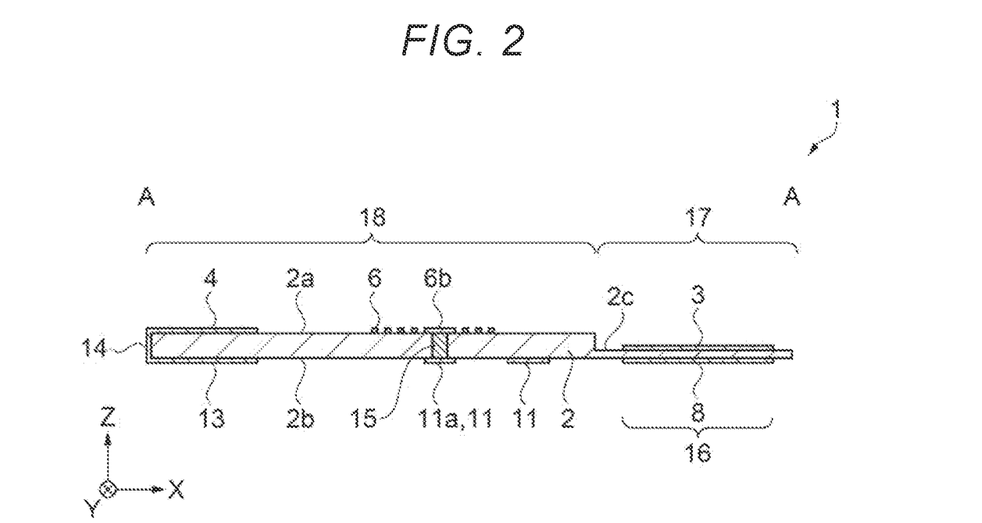
FIG. 2 is a diagrammatic side cross-sectional view showing the configuration of the vibrator device.
Figure 3:
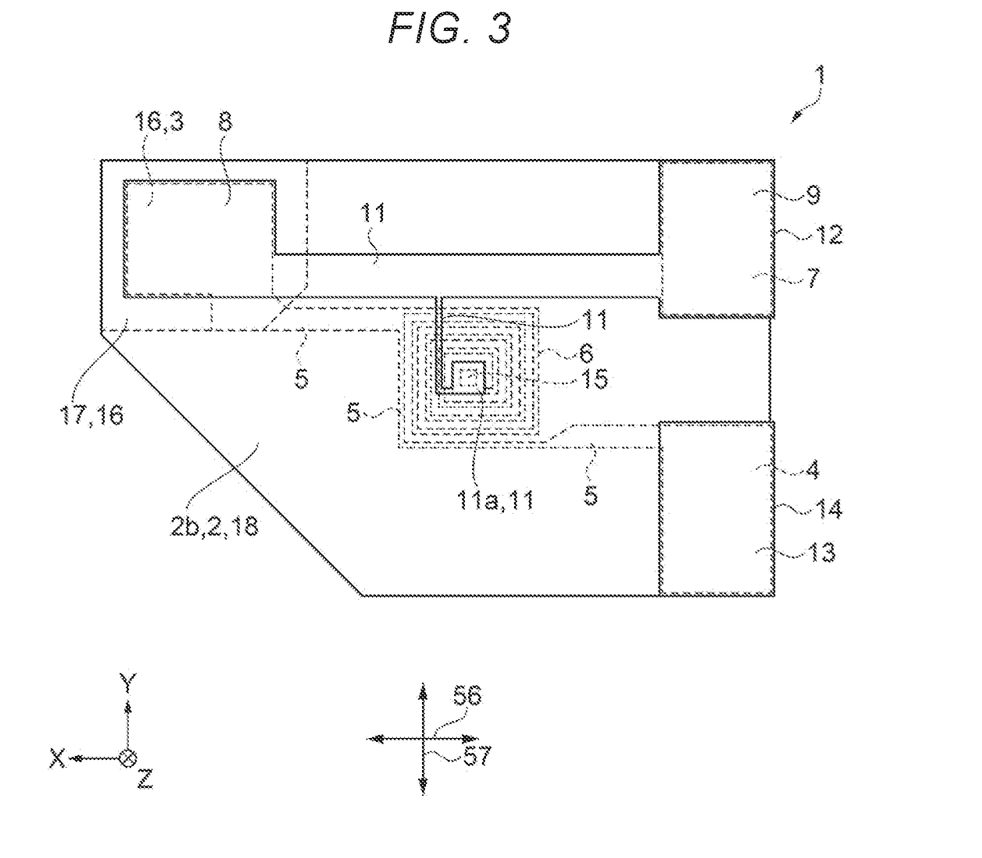
FIG. 3 is a diagrammatic plan view showing the configuration of the vibrator device.

A vibrator device 1 includes a vibrator element 2, as shown in FIGS. 1 to 3. The vibrator element 2 is formed of a member that provides a piezoelectric effect, and the material of the vibrator element 2 is a quartz crystal in the present embodiment. The vibrator element 2 is formed by using a quartz crystal wafer as a single-crystal substrate cut at a predetermined cutting angle off a quartz crystal Lumbered, which is a block-shaped piece of a synthetic quartz crystal ore having a known crystal axis. The predetermined cutting angle refers to a cutting angle that inclines by a target angle with respect to the crystal axis of the quartz crystal. The vibrator device 1 is formed by using what is called an AT-cut quartz crystal cut along a plane inclining by a cutting angle of 35°15' with respect to the crystal axis and operates in a thickness-shear vibration mode.

The vibrator element 2 has a pentagonal shape in the plan view as a result of cutting one corner of a rectangle. The vibrator element 2 is elongated in one direction in the plan view. The major direction is called a lengthwise direction 56 and a direction X. The minor direction of the vibrator element 2 is called a widthwise direction 57 and a direction Y. The thickness direction of the vibrator element 2 is called a direction Z. The location at which one corner of the rectangular vibrator element 2 is cut off is the location shifted in the directions +X and −Y.

The vibrator element 2 has a first surface 2a as a surface on one side and a second surface 2b as a surface on the other side. The direction from the second surface 2b toward the first surface 2a is called a direction +Z.

A first excitation electrode 3, a first pad electrode 4, and a first drawn wiring line 5 are disposed at the first surface 2a of the vibrator element 2. The first drawn wiring line 5 is electrically coupled to both the first excitation electrode 3 and the first pad electrode 4. A spiral first electrode pattern 6 is further disposed at the first surface 2a of the vibrator element 2. A first outer circumferential end section 6a as an outer circumferential end section of the first electrode pattern 6 is electrically coupled to the first drawn wiring line 5.

The first pad electrode 4 is located at the corner shifted in the directions −X and −Y. The first excitation electrode 3 is located at the corner shifted in the directions +X and +Y. In addition to the above, a third pad electrode 7 is disposed at the first surface 2a. The third pad electrode 7 is located at the corner shifted in the directions −X and +Y.

A second excitation electrode 8, a second pad electrode 9, and a second drawn wiring line 11 are disposed at the second surface 2b of the vibrator element 2. The first excitation electrode 3 and the second excitation electrode 8 are disposed so as to face each other with the vibrator element 2 therebetween. The second drawn wiring line 11 is electrically coupled to both the second excitation electrode 8 and the second pad electrode 9.

The second pad electrode 9 is disposed so as to face the third pad electrode 7 with the vibrator element 2 therebetween. The second pad electrode 9 and the third pad electrode 7 are electrically coupled to each other via a second side surface wiring line 12. In addition to the above, a fourth pad electrode 13 is disposed at the second surface 2b. The fourth pad electrode 13 is disposed so as to face the first pad electrode 4 with the vibrator element 2 therebetween. The fourth pad electrode 13 and the first pad electrode 4 are electrically coupled to each other via a first side surface wiring line 14. The second side surface wiring line 12 and the first side surface wiring line 14 are disposed at side surfaces of the vibrator element 2.

A first central end section 6b as a central end portion of the first electrode pattern 6 is a square pad. A coupling pad 11a is provided at the second surface 2b at the location where the second drawn wiring line 11 faces the first central end section 6b with the vibrator element 2 therebetween. The vibrator element 2 is provided with a through electrode 15 between the coupling pad 11a and the first central end section 6b. The first central end section 6b is electrically coupled to the second drawn wiring line 11 via the through electrode 15 provided in the vibrator element 2.

According to the configuration described above, the vibrator element 2 includes the spiral first electrode pattern 6 at the first surface 2a. The first electrode pattern 6 functions as an inductor. The first central end section 6b at the center of the first electrode pattern 6 is electrically coupled to the second drawn wiring line 11 via the through electrode 15. The second drawn wiring line 11 is electrically coupled to both the second excitation electrode 8 and the second pad electrode 9. The first electrode pattern 6 is therefore electrically coupled to both the second excitation electrode 8 and the second pad electrode 9. The first outer circumferential end section 6a at the outer circumference of the first electrode pattern 6 is disposed at the first surface 2a and electrically continuous with the first drawn wiring line 5. The first drawn wiring line 5 is electrically coupled to both the first excitation electrode 3 and the first pad electrode 4. The first electrode pattern 6 is therefore electrically continuous with both the first excitation electrode 3 and the first pad electrode 4, which are disposed at the first surface 2a.

In the vibrator device 1, there is no pad electrode at the first central end section 6b of the first electrode pattern 6, unlike in related art, and the first central end section 6b of the first electrode pattern 6 is not wired using a bonding wire. Variation in the value of the inductance of the first electrode pattern 6 can therefore be suppressed. The distance between the second drawn wiring line 11 and the first electrode pattern 6 can be separate from each other by at least the thickness of the vibrator element 2. Magnetic coupling of the magnetic flux generated in the first electrode pattern 6 to the second drawn wiring line 11 can therefore be suppressed. As a result, variation in oscillation characteristics of the vibrator element 2 is unlikely to occur, whereby an excellent vibrator device 1 can be provided.

The through electrode 15 is disposed in a central portion of the first electrode pattern 6. The second drawn wiring line 11 crosses the first electrode pattern 6 in the plan view viewed in the direction Z and extends from the through electrode 15 to a position outside the first electrode pattern 6.

The configuration described above allows the distance between the second drawn wiring line 11 and the first electrode pattern 6 to be separate from each other by at least the thickness of the vibrator element 2. The magnetic coupling of the magnetic flux generated in the first electrode pattern 6 to the second drawn wiring line 11 can therefore be suppressed.

In the vibrator device 1, the first pad electrode 4, the first electrode pattern 6, and the first excitation electrode 3 are arranged in the lengthwise direction 56 of the vibrator element 2 in the following order: the first pad electrode 4, the first electrode pattern 6, and the first excitation electrode 3. The vibrator device 1 forms a piezoelectric vibrator section 16 as a vibrator section where the vibrator element 2 vibrates at the location where the first excitation electrode 3 and the second excitation electrode 8 are disposed. In the vibrator device 1, the first pad electrode 4 and the third pad electrode 7 are fixed, and the piezoelectric vibrator section 16 vibrates.

According to the configuration described above, the distance between the first pad electrode 4 and the first excitation electrode 3 can be increased as compared with a case where no first electrode pattern 6 is provided. Therefore, even when stress is induced in a portion, of the vibrator element 2, facing the first pad electrode 4, influence of the stress on the piezoelectric vibrator section 16 can be suppressed.

The vibrator element 2 in a first area 17, where the first excitation electrode 3 and the second excitation electrode 8 are provided, is thinner than the vibrator element 2 in a second area 18, where the first pad electrode 4 and the second pad electrode 9 are provided. That is, the vibrator device 1 has what is called an inverted mesa structure. In the first area 17, a recess 2c is formed in the vibrator element 2.

According to the configuration described above, since the vibrator element 2 in the first area 17, where the first excitation electrode 3 and the second excitation electrode 8 are provided, is thin, the frequency at which the piezoelectric vibrator section 16 vibrates can be increased. A vibrator device 1 operable at high frequencies can therefore be provided. When the vibrator device 1 does not need to operate at high frequencies, the second area 18 may be as thick as the first area 17 or may be thicker than the first area 17.

The vibrator element 2 is narrower on the side facing in the direction +X than on the side facing in the direction −X. The mass of the vibrator element 2 on the side facing in the direction +X is therefore smaller than that on the side facing in the direction −X. The vibrator device 1 is used in the form of a cantilever with the −X-direction side thereof fixed. When impact is applied to the vibrator device 1, the +X-direction side of the vibrator device 1 vibrates. Since the mass of the portion, of the vibrator device 1, on the side facing in the direction +X is smaller than that on the side facing in the direction −X, the vibration of the vibrator device 1 can be suppressed.

The vibrator device 1 can be manufactured by using a known method. A quartz crystal wafer is etched to form the through hole for the through electrode 15, the first area 17, and the outer shape of the vibrator element 2. A metal film made, for example, of gold is then deposited by vapor deposition or sputtering on a base layer made of nickel or chromium. The metal film is then etched and patterned by using photolithography to form the first excitation electrode 3, the second excitation electrode 8, the first pad electrode 4, the second pad electrode 9, the third pad electrode 7, the fourth pad electrode 13, the first electrode pattern 6, the first drawn wiring line 5, the second drawn wiring line 11, the through electrode 15, and other components.

Figure 4:
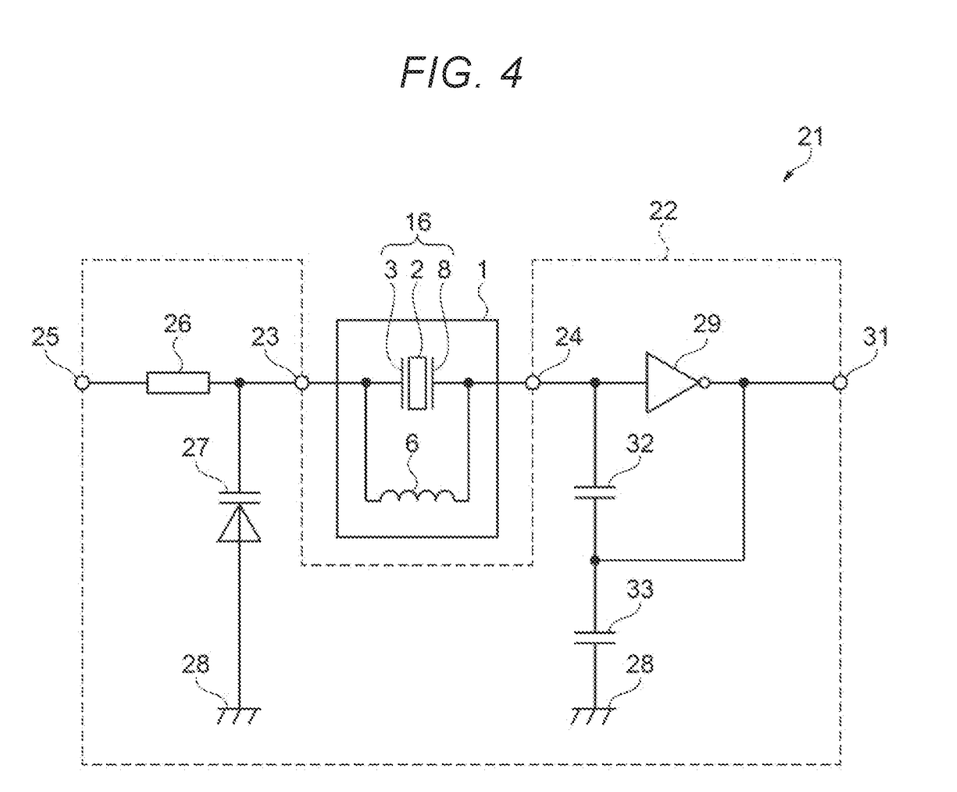
FIG. 4 is a circuit diagram showing an example of an oscillator circuit.

An electronic device 21 includes the vibrator device 1 and a drive circuit substrate 22, as shown in FIG. 4. It is noted that FIG. 4 shows only selected portions of the circuit, and a circuit for oscillation of the vibrator device 1 is omitted. The drive circuit substrate 22 has a first terminal 23 and a second terminal 24. The vibrator device 1 is coupled to and between the first terminal 23 and the second terminal 24. The coupling in the description of FIGS. 4 and 5 is electrical coupling.

The drive circuit substrate 22 includes a control voltage input terminal 25. The control voltage input terminal 25 is coupled to one end of a control voltage application resistor 26. The other end of the control voltage application resistor 26 is coupled to a variable capacitance diode 27 and the first terminal 23. The variable capacitance diode 27 has a cathode coupled to the control voltage application resistor 26 and an anode coupled to a ground 28.

The second terminal 24 is coupled to the input of an amplifier 29. The output of the amplifier 29 is coupled to a frequency output terminal 31. A first capacitor 32 and a second capacitor 33 are coupled in series to and between the second terminal 24 and the ground 28. One end of the first capacitor 32 is coupled to the second terminal 24. The other end of the first capacitor 32 is coupled to one end of the second capacitor 33 and the frequency output terminal 31. The other end of the second capacitor 33 is coupled to the ground 28.

In the vibrator device 1, the first electrode pattern 6 is electrically coupled in parallel to the piezoelectric vibrator section 16, in which the first excitation electrode 3 and the second excitation electrode 8 sandwich the vibrator element 2.

According to the configuration described above, the first electrode pattern 6 and the piezoelectric vibrator section 16 are in parallel to each other. The first electrode pattern 6 therefore functions as an inductor and can cancel stray capacitance. The stray capacitance includes capacitance produced by package wiring. Since the first electrode pattern 6 is not formed around the first excitation electrode 3, eddy current produced at the first excitation electrode 3 can be reduced. The first electrode pattern 6 can therefore provide high-Q inductance.

Figure 5:
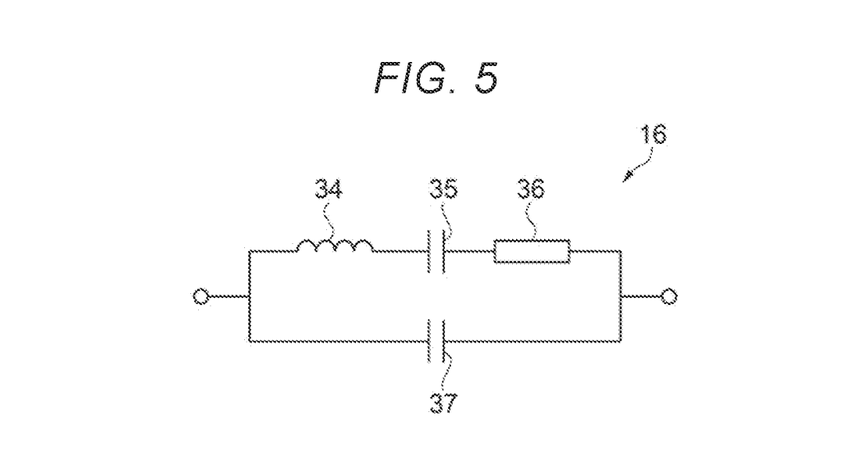
FIG. 5 is a circuit diagram for describing an example of a circuit equivalent to a piezoelectric vibrator section.

A typical circuit equivalent to the piezoelectric vibrator section 16 is a circuit in which equivalent series inductance 34, equivalent series capacitance 35, and equivalent series resistance 36 are coupled in series to each other and equivalent parallel capacitance 37 is coupled in parallel to the equivalent series inductance 34, the equivalent series capacitance 35, and the equivalent series resistance 36, as shown in FIG. 5. The first electrode pattern 6 can cancel stray capacitance including the equivalent parallel capacitance 37. Let C0 be the equivalent parallel capacitance 37 and C1 be the equivalent series capacitance 35, and C0/C1 is preferably small. The frequency range of the piezoelectric vibrator section 16 can be widened accordingly.

Let $\omega$ be the vibration frequency of the piezoelectric vibrator section 16 and L be the inductance of the first electrode pattern 6, and it is preferable that L satisfies $\omega C0 > 1/(\omega L)$. Influence of C0 can thus be cancelled out. To increase the L value, the vibrator device 1 can be overlaid on another vibrator device that forms an inductor.

It is preferable that the first electrode pattern 6 is thicker than the first excitation electrode 3 and the second excitation electrode 8. It is further preferable to optimize the Q value of the first electrode pattern 6 and the CI value of the piezoelectric vibrator section 16.

Second Embodiment

Figure 6:
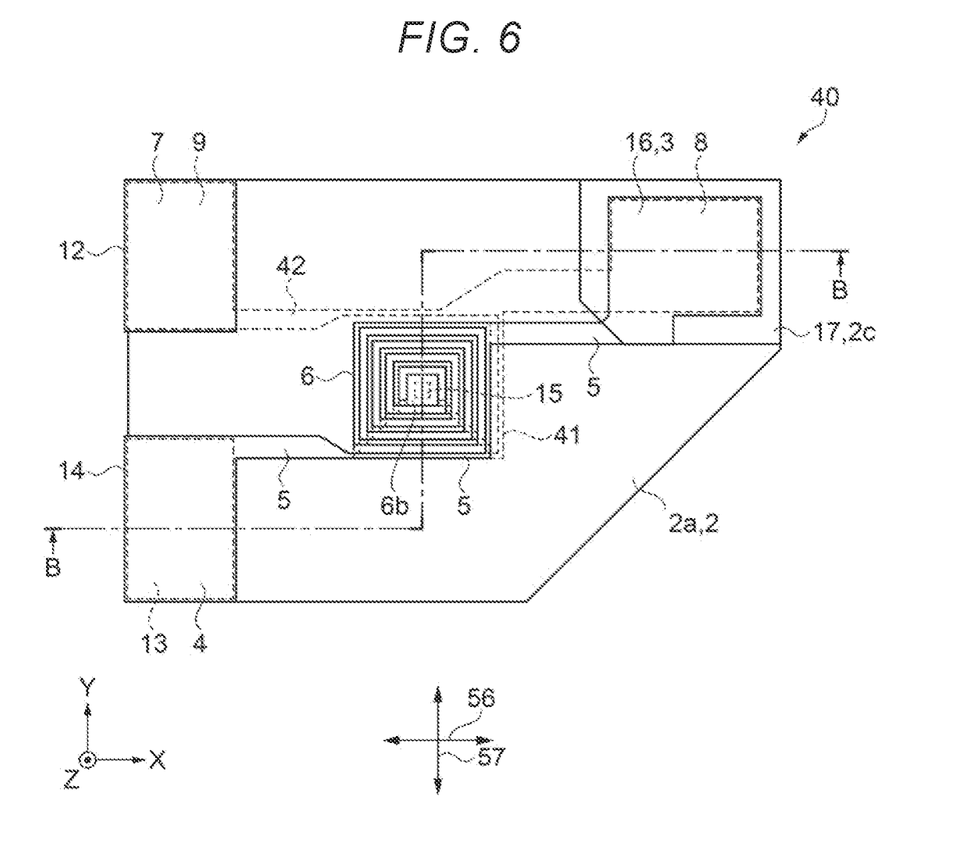
FIG. 6 is a diagrammatic plan view showing the configuration of a vibrator device according to a second embodiment.
Figure 8:
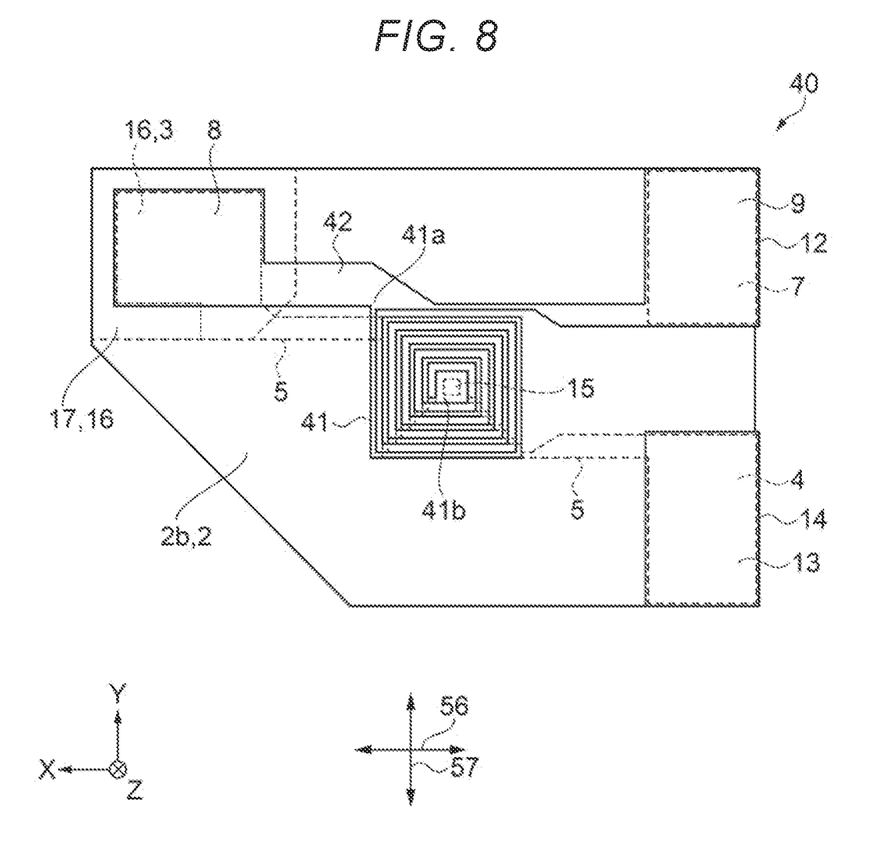
FIG. 8 is a diagrammatic plan view showing the configuration of the vibrator device.

FIG. 6 shows a vibrator device 40 viewed from the side facing the first surface 2a. FIG. 7 is a cross-sectional view showing the vibrator device 40 taken along the line BB in FIG. 6. FIG. 8 shows the vibrator device 40 viewed from the side facing the second surface 2b. The vibrator device 40 may include a second electrode pattern 41 at the second surface 2b, as shown in FIGS. 6 to 8.

At the second surface 2b of the vibrator device 40, the second excitation electrode 8 and the second pad electrode 9 are electrically coupled to each other via a second drawn wiring line 42. The second electrode pattern 41, which is a spiral electrode pattern, is provided at the second surface 2b. A second central end section 41b as a central end section of the second electrode pattern 41 is electrically coupled to the first electrode pattern 6 via the through electrode 15. A second outer circumferential end section 41a as an outer circumferential end section of the second electrode pattern 41 is electrically coupled to the second drawn wiring line 42.

According to the configuration described above, the first electrode pattern 6 and the second electrode pattern 41 are electrically coupled to each other. The first electrode pattern 6 and the second electrode pattern 41, which are each a spiral electrode pattern, can form an inductor having a larger number of turns than in a case where only the first electrode pattern 6 is provided.

Third Embodiment

Figure 9:
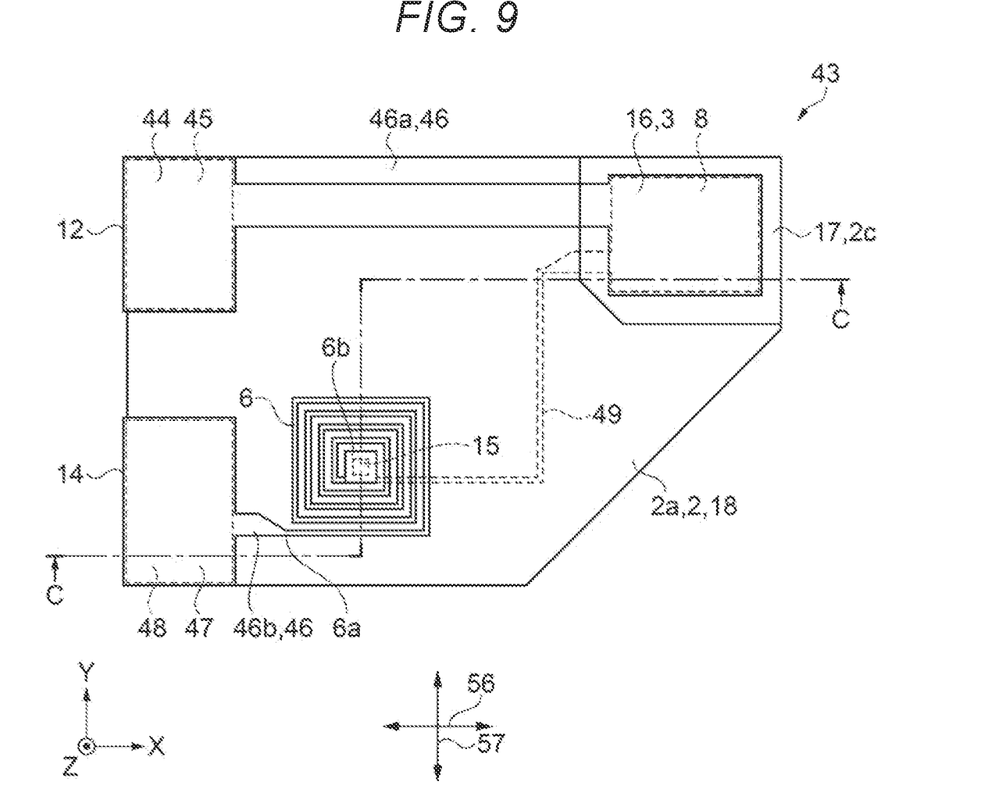
FIG. 9 is a diagrammatic plan view showing the configuration of a vibrator device according to a third embodiment.
Figure 10:
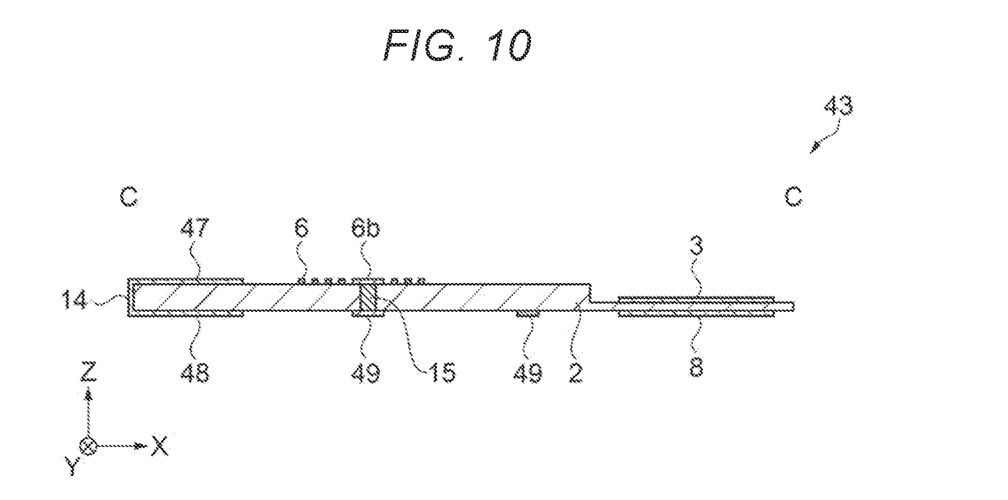
FIG. 10 is a diagrammatic side cross-sectional view showing the configuration of the vibrator device.
Figure 11:
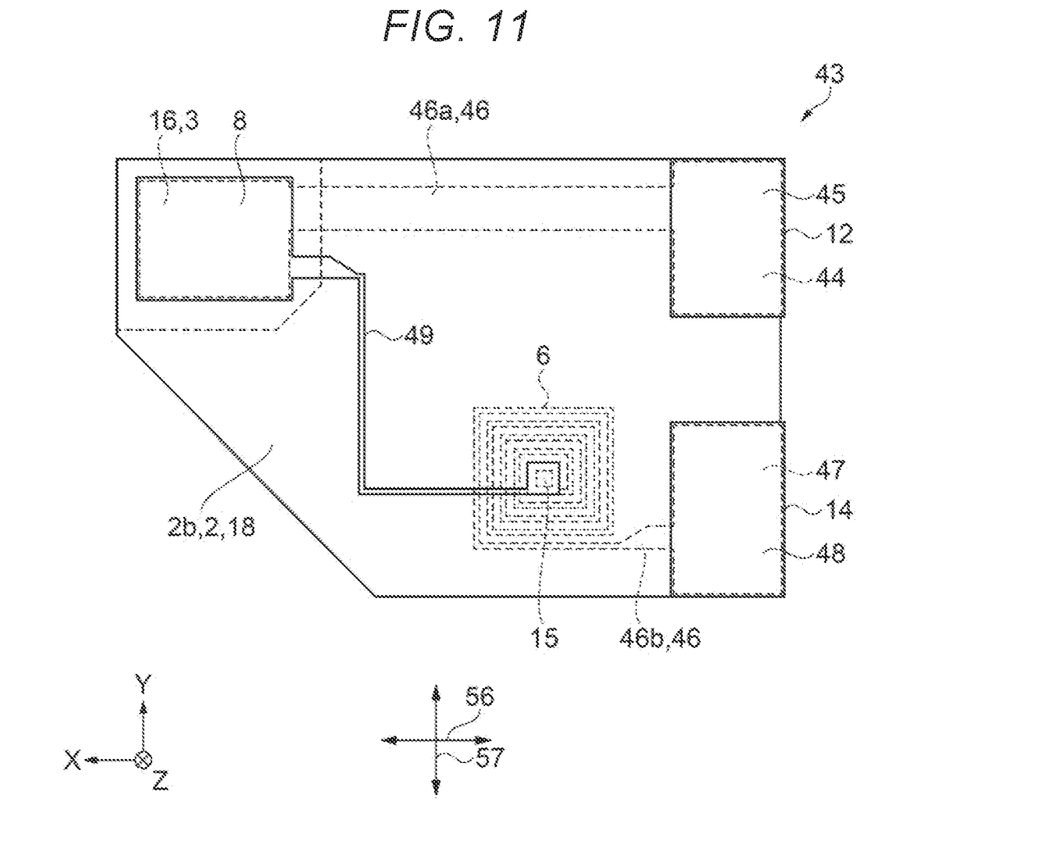
FIG. 11 is a diagrammatic plan view showing the configuration of the vibrator device.

FIG. 9 shows a vibrator device 43 viewed from the side facing the first surface 2a. FIG. 10 is a cross-sectional view showing the vibrator device 43 taken along the line CC in FIG. 9. FIG. 11 shows the vibrator device 43 viewed from the side facing the second surface 2b. In the vibrator device 43, the first electrode pattern 6 is electrically coupled in series to the piezoelectric vibrator section 16, in which the first excitation electrode 3 and the second excitation electrode 8 sandwich the vibrator element 2, as shown in FIGS. 9 to 11.

The first surface 2a is provided with a first pad electrode 44 at the corner shifted in the directions −X and +Y. The second surface 2b is further provided with a fourth pad electrode 45 at a location where the fourth pad electrode 45 faces the first pad electrode 44 with the vibrator element 2 sandwiched therebetween. The first pad electrode 44 and the fourth pad electrode 45 are electrically coupled to each other via the second side surface wiring line 12. The first surface 2a is provided with a first drawn wiring line 46. The first drawn wiring line 46 includes a first wiring line 46a and a second wiring line 46b. The first excitation electrode 3 and the first pad electrode 44 are electrically coupled to each other via the first wiring line 46a as the first drawn wiring line.

The first surface 2a is provided with a third pad electrode 47 at the corner shifted in the directions −X and −Y. The second surface 2b is provided with a second pad electrode 48 at a location where the second pad electrode faces the third pad electrode 47 with the vibrator element 2 sandwiched therebetween. The third pad electrode 47 and the second pad electrode 48 are electrically coupled to each other via the first side surface wiring line 14. The first outer circumferential end section 6a and the third pad electrode 47 are electrically coupled to each other via the second wiring line 46b.

The second surface 2b is provided with a second drawn wiring line 49. The second drawn wiring line 49 is electrically coupled to the through electrode 15. The second drawn wiring line 49 is further electrically coupled to the second excitation electrode 8.

According to the configuration described above, the first electrode pattern 6 is coupled in series to the piezoelectric vibrator section 16. Therefore, when the first electrode pattern 6 functions as an inductor and the vibrator device 43 is used in a voltage-controlled quartz crystal oscillator, the frequency variable width of the voltage-controlled quartz crystal oscillator can be expanded.

Fourth Embodiment

Figure 12:
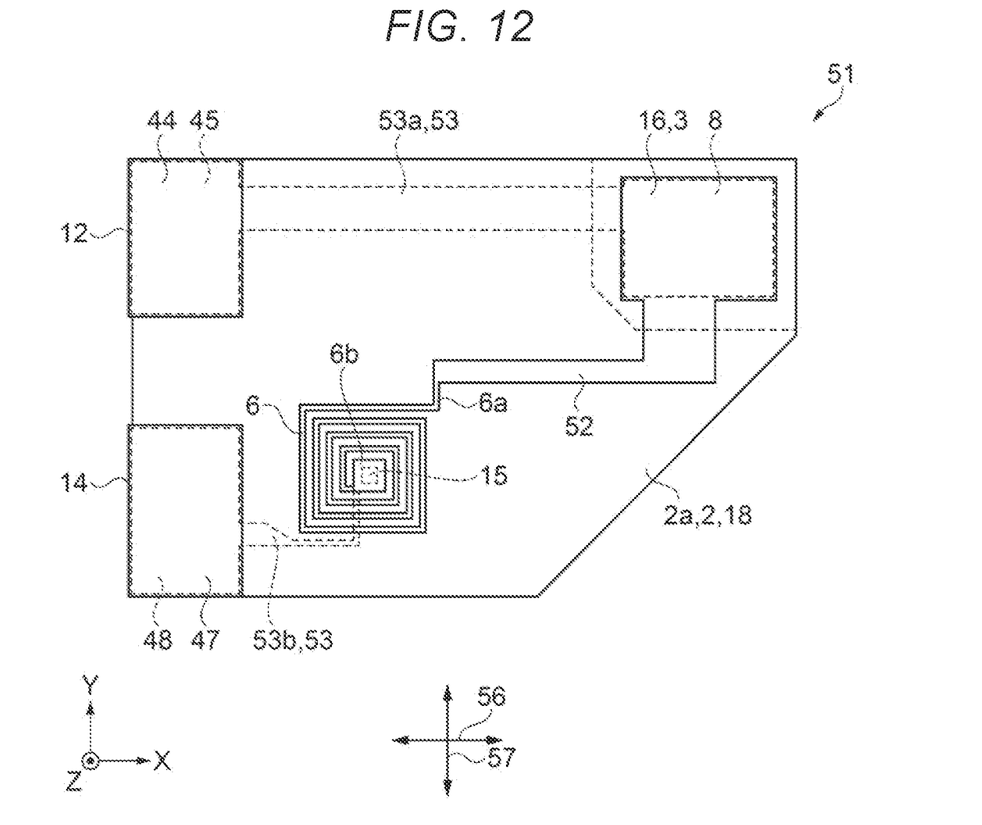
FIG. 12 is a diagrammatic plan view showing the configuration of a vibrator device according to a fourth embodiment.
Figure 13:
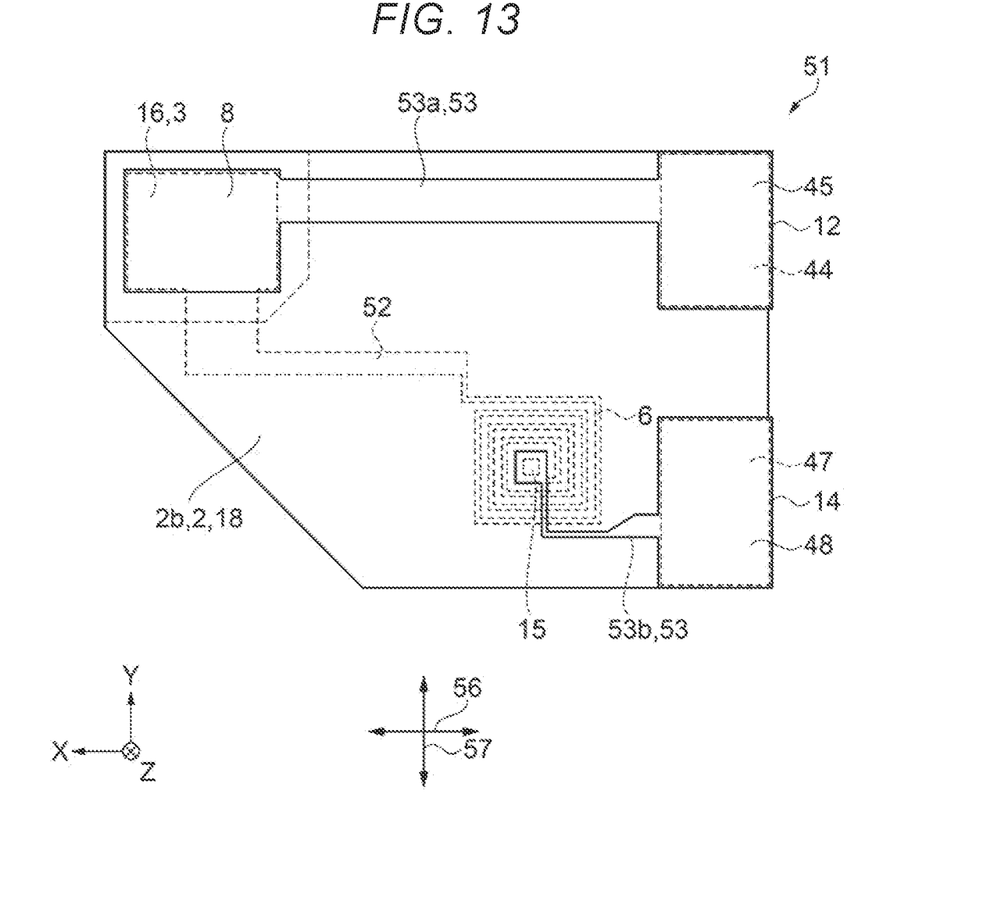
FIG. 13 is a diagrammatic plan view showing the configuration of the vibrator device.

FIG. 12 shows a vibrator device 51 viewed from the side facing the first surface 2a. FIG. 13 shows the vibrator device 51 viewed from the side facing the second surface 2b. In the vibrator device 51, the first electrode pattern 6 is electrically coupled in series to the piezoelectric vibrator section 16, in which the first excitation electrode 3 and the second excitation electrode 8 sandwich the vibrator element 2, as shown in FIGS. 12 to 13.

The first surface 2a is provided with a first drawn wiring line 52. The first outer circumferential end section 6a of the first electrode pattern 6 is electrically coupled to the first drawn wiring line 52. The first drawn wiring line 52 is electrically coupled to the first excitation electrode 3.

The first surface 2a is provided with the first pad electrode 44 at the corner shifted in the directions −X and +Y. The second surface 2b is further provided with the fourth pad electrode 45 at the location where the fourth pad electrode 45 faces the first pad electrode 44 with the vibrator element 2 sandwiched therebetween. The first pad electrode 44 and the fourth pad electrode 45 are electrically coupled to each other via the second side surface wiring line 12.

The second surface 2b is provided with a second drawn wiring line 53. The second drawn wiring line 53 includes a third wiring line 53a and a fourth wiring line 53b. The third wiring line 53a electrically couples the second excitation electrode 8 to the fourth pad electrode 45. The third wiring line 53a is electrically coupled to the first pad electrode 44 via the fourth pad electrode 45 and the second side surface wiring line 12.

The first surface 2a is provided with the third pad electrode 47 at the corner shifted in the directions −X and −Y. The second surface 2b is provided with the second pad electrode 48 at the location where the second pad electrode 48 faces the third pad electrode 47 with the vibrator element 2 sandwiched therebetween. The third pad electrode 47 and the second pad electrode 48 are electrically coupled to each other via the first side surface wiring line 14.

The fourth wiring line 53b as the second drawn wiring line is electrically coupled to the through electrode 15 and the second pad electrode 48. The third pad electrode 47, the first side surface wiring line 14, the second pad electrode 48, the fourth wiring line 53b, the through electrode 15, the first electrode pattern 6, the first drawn wiring line 52, and the first excitation electrode 3 are coupled in series to each other in this order.

According to the configuration described above, the first electrode pattern 6 is coupled in series to the piezoelectric vibrator section 16. Therefore, when the first electrode pattern 6 functions as an inductor and is used in a voltage-controlled quartz crystal oscillator, the frequency variable width of the voltage-controlled quartz crystal oscillator can be expanded.

Fifth Embodiment

Figure 14:
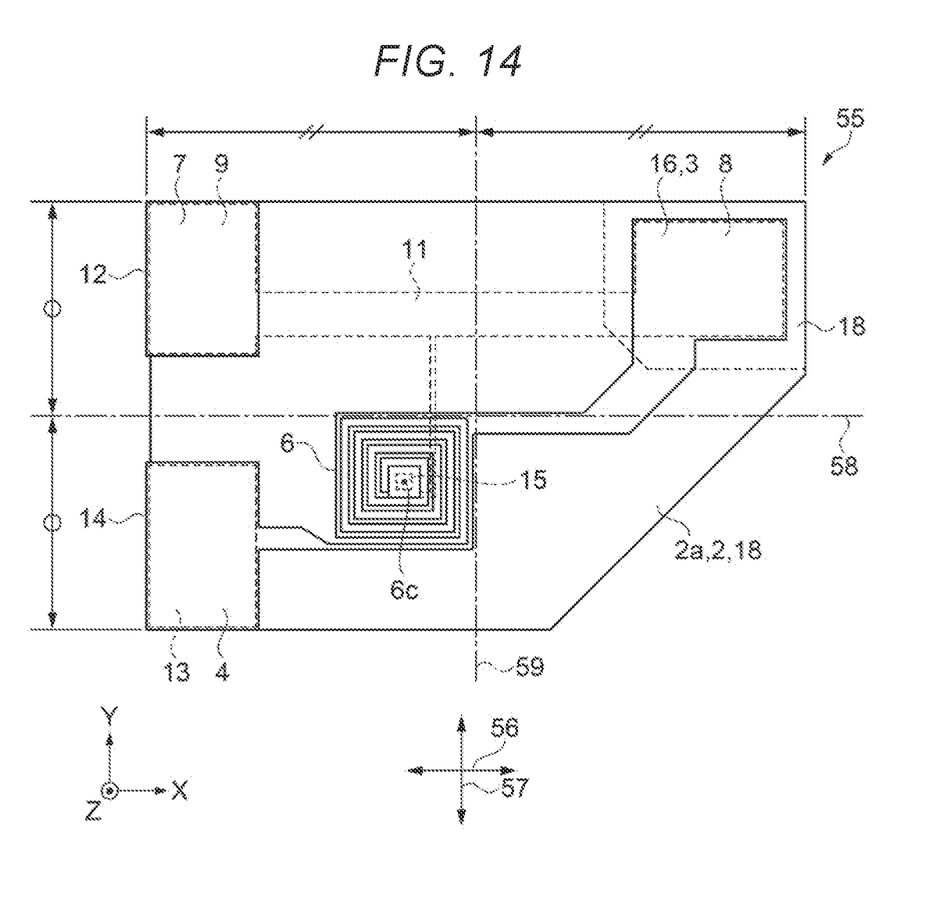
FIG. 14 is a diagrammatic plan view showing the configuration of a vibrator device according to a fifth embodiment.

FIG. 14 shows a vibrator device 55 viewed from the side facing the first surface 2a. The vibrator device 55 includes the vibrator element 2, as shown in FIG. 14. The directions +X and −X are the lengthwise direction 56. The directions +Y and −Y are the widthwise direction 57. The vibrator element 2 is shorter in the widthwise direction 57 than in the lengthwise direction 56.

A center line passing through the center of the vibrator element 2 in the widthwise direction 57 and extending along the lengthwise direction 56 is called a first center line 58. The first excitation electrode 3 is shifted from the first center line 58 in the direction +Y, and the center 6c of the first electrode pattern 6 is shifted from the first center line 58 in the direction −Y. Therefore, the first excitation electrode 3 is disposed on one side of the first center line 58, and the center 6c of the first electrode pattern 6 is disposed on the other side of the first center line 58. The one side is the side facing in the direction +Y. The other side is the side facing in the direction −Y.

According to the configuration described above, the distance between the first excitation electrode 3 and the first electrode pattern 6 can be longer than in the case where the first excitation electrode 3 and the center 6c of the first electrode pattern 6 are on one side of the first center line 58 along the lengthwise direction 56. As a result, the situation in which the magnetic flux generated in the first electrode pattern 6 is magnetically coupled to the first excitation electrode 3 and the first excitation electrode 3 affects the value of the inductance of the first electrode pattern 6 can be avoided.

A center line passing through the center of the vibrator element 2 in the lengthwise direction 56 and extending along the widthwise direction 57 is called a second center line 59. The first excitation electrode 3 is shifted from the second center line 59 in the direction +X, and the center 6c of the first electrode pattern 6 is shifted from the second center line 59 in the direction −X. Therefore, the first excitation electrode 3 is disposed on one side of the second center line 59, and the center 6c of the first electrode pattern 6 is disposed on the other side of the second center line 59. The one side is the side facing in the direction +X. The other side is the side facing in the direction −X.

According to the configuration described above, the distance between the first excitation electrode 3 and the first electrode pattern 6 can be longer than in the case where the first excitation electrode 3 and the center 6c of the first electrode pattern 6 are on one side of the second center line 59 along the widthwise direction 57. As a result, the situation in which the magnetic flux generated in the first electrode pattern 6 is magnetically coupled to the first excitation electrode 3 and the first excitation electrode 3 affects the value of the inductance of the first electrode pattern 6 can be avoided.

In the vibrator device 55, the first excitation electrode 3 is disposed on one side of the first center line 58 and the second center line 59, and the center 6c of the first electrode pattern 6 is disposed on the other side of the two center lines. The situation in which the first excitation electrode 3 affects the value of the inductance of the first electrode pattern 6 can therefore be avoided. The one side is the side facing in the directions +X and +Y. The other side is the side facing in the directions −X and −Y.

Sixth Embodiment

Figure 15:
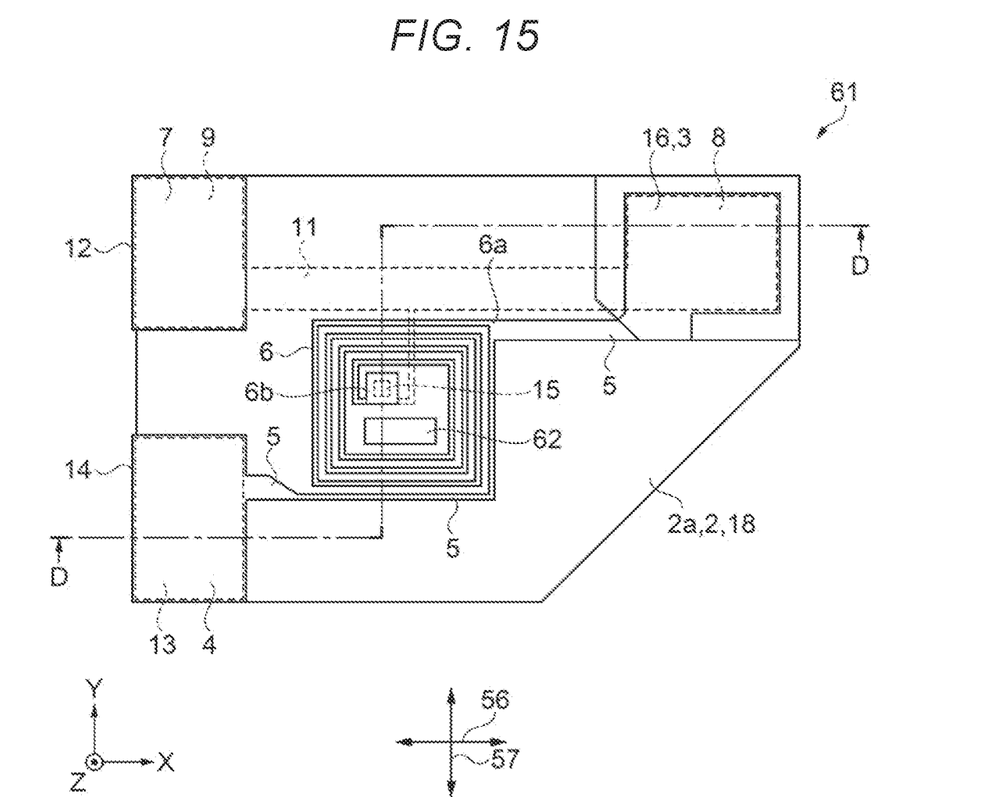
FIG. 15 is a diagrammatic plan view showing the configuration of a vibrator device according to a sixth embodiment.
Figure 16:
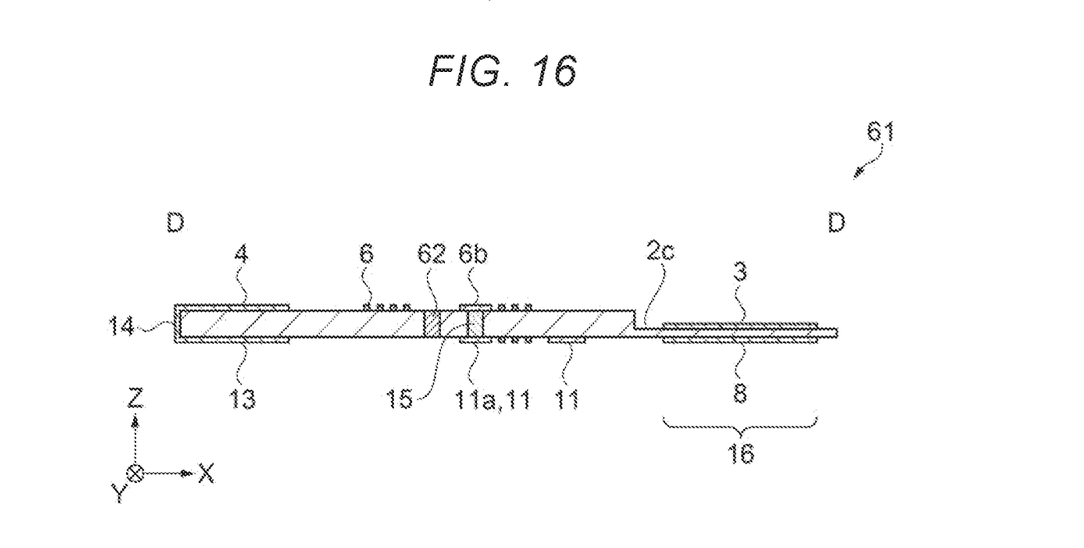
FIG. 16 is a diagrammatic side cross-sectional view showing the configuration of the vibrator device.

FIG. 15 shows a vibrator device 61 viewed from the side facing the first surface 2a. FIG. 16 is a cross-sectional view showing the vibrator device 61 taken along the line DD in FIG. 15. The vibrator device 61 includes the first electrode pattern 6 at the first surface 2a, as shown in FIGS. 15 to 16. The vibrator device 61 includes a metal via 62 inside the first electrode pattern 6. The metal via 62 is insulated from the first electrode pattern 6 and is electrically floating. The metal via 62 is made of a material having high magnetic permeability. In the present embodiment, the metal via 62 is made, for example, of pure iron.

According to the configuration described above, providing the metal via 62 having low magnetic resistance inside the magnetic flux generated by the inductor allows an increase in the value of the inductance of the first electrode pattern 6. There may be more than one metal via 62.

Seventh Embodiment

Figure 17:
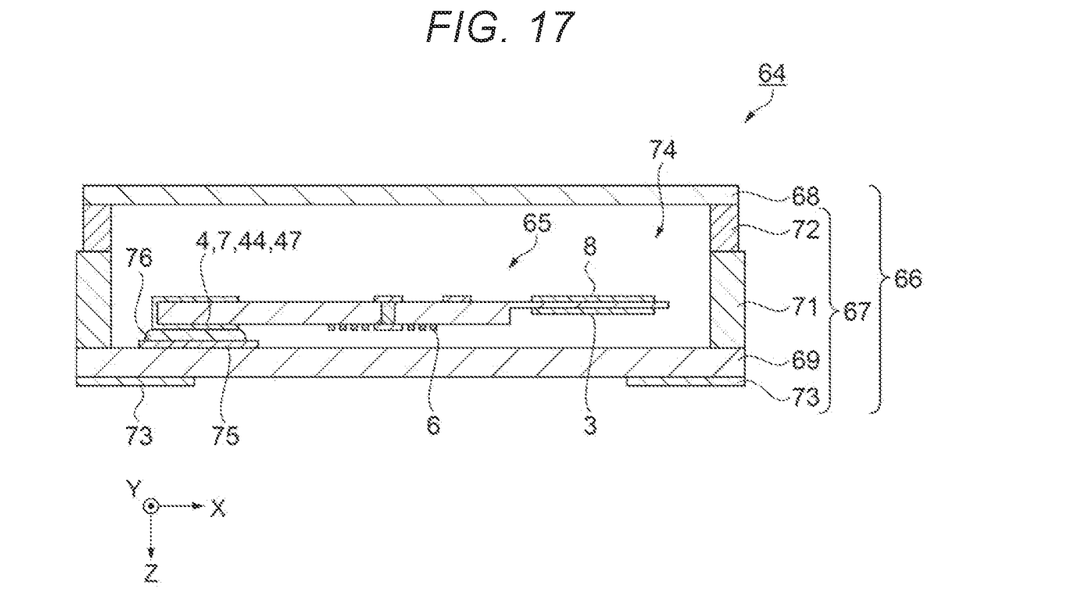
FIG. 17 is a diagrammatic side cross-sectional view showing the configuration of a vibrator according to a seventh embodiment.

A vibrator 64 includes a vibrator device 65 and a package 66 in which the vibrator device 65 is incorporated, as shown in FIG. 17. The vibrator device 65 is any of the vibrator devices 1, 40, 43, 51, 55, and 61.

In detail, the package 66 is formed of a package main body 67, which is formed in the shape of a rectangular box for accommodating the vibrator device 65, and a lid member 68 made, for example, of metal, ceramic, or glass.

The package main body 67 is formed by stacking a first substrate 69, a second substrate 71, and a sealing ring 72. A plurality of mounting terminals 73 are formed at the outer bottom surface of the first substrate 69. The second substrate 71 is an annular element with a central portion thereof removed. The sealing ring 72 made, for example, of Kovar is formed at an upper circumferential edge of the second substrate 71. The second substrate 71 forms a cavity 74, which accommodates the vibrator device 65. A plurality of element mounting pads 75, which are electrically continuous with the mounting terminals 73 via wiring lines that are not shown but are formed in the first substrate 69, are provided in predetermined positions on the upper surface of the first substrate 69. The element mounting pads 75 are disposed so as to correspond to the first pad electrode 4, the third pad electrode 7 or the first pad electrode 44, and the third pad electrode 47 when the vibrator device 65 is placed.

The first substrate 69 and the second substrate 71 of the package main body 67 are made, for example, of a ceramic insulating material. Electrodes and terminals provided in the package main body 67 or wiring patterns, intra-layer wiring patterns, or any other wiring patterns that electrically couple the electrodes and terminals to each other are typically formed by performing screen printing in which a metal wiring material, such as tungsten and molybdenum, is printed on a ceramic insulating material, baking the resulting printed material, and plating nickel, gold, or any other element on the resulting baked material.

To support and fix the vibrator device 65, an electrically conductive adhesive 76 is first applied to the first pad electrode 4, the third pad electrode 7 or the first pad electrode 44, and the third pad electrode 47 of the vibrator device 65, and the element mounting pads 75, and the first pad electrode 4, the third pad electrode 7 or the first pad electrode 44, and the third pad electrode 47 are then placed on the element mounting pads 75, followed by load application to the pad electrodes. The electrically conductive adhesive 76 can, for example, be a polyimide-, silicon-, or epoxy-based resin mixed, for example, with silver filaments or nickel powder.

The electrically conductive adhesive 76 is then heated for a predetermined period in a high-temperature furnace set at a predetermined temperature to cure the electrically conductive adhesive 76. After the electrically conductive adhesive 76 is cured, annealing is performed on the cured electrically conductive adhesive 76. Frequency adjustment is then performed to increase or reduce the mass of the second excitation electrode 8. To reduce the mass of the second excitation electrode 8, it is preferable to cause the first electrode pattern 6 to face the first substrate 69 in order to prevent metal powder generated by the mass reduction operation from adhering to the first electrode pattern 6.

The sealing ring 72 is then formed at the upper surface of the second substrate 71. The lid member 68 is placed on the sealing ring 72. The lid member 68 is seam-welded to the sealing ring 72 in a vacuum or a nitrogen gas atmosphere. The cavity 74 is thus sealed, and the vibrator 64 is completed.

According to the configuration described above, the vibrator 64 includes any of the vibrator devices 1, 40, 43, 51, 55, and 61 described above in the package 66. The vibrator devices 1, 40, 43, 51, 55, and 61 described above are each a vibrator device that excels in oscillation characteristics. The vibrator 64 can therefore be a vibrator including a vibrator device that excels in oscillation characteristics.

Eighth Embodiment

Figure 18:
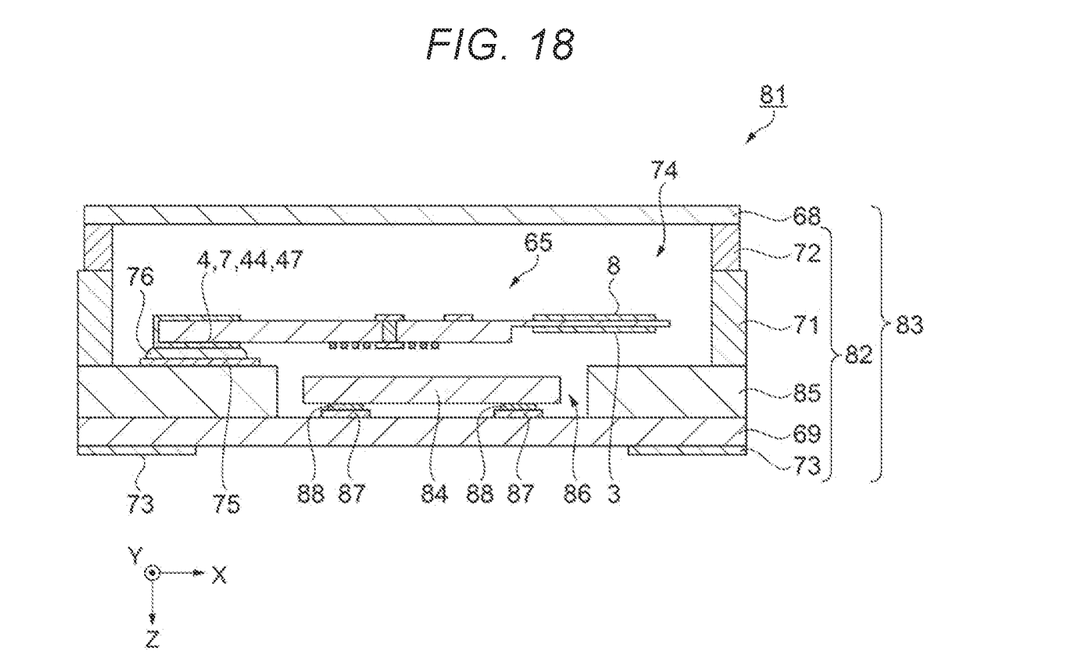
FIG. 18 is a diagrammatic side cross-sectional view showing the configuration of an electronic device according to an eighth embodiment.

An electronic device 81 includes the vibrator device 65, a package 83 in which the vibrator device 65 is incorporated, and a drive circuit substrate 84, which supplies the first excitation electrode 3 and the second excitation electrode 8 with a drive voltage, as shown in FIG. 18. The vibrator device 65 is any of the vibrator devices 1, 40, 43, 51, 55, and 61.

In detail, the package 83 includes a package main body 82 and the lid member 68. The drive circuit substrate 84, on which an oscillation circuit is mounted, excites the vibrator device 65. The drive circuit substrate 84 is provided in the form of an IC chip.

The vibrator device 65 and the drive circuit substrate 84 including the oscillation circuit are accommodated in the cavity 74 in the package main body 82 and bonded to the package main body 82. The electronic device 81 is thus sealed. The electronic device 81 is a surface mountable, single-chip quartz crystal oscillator of what is called an SMD (surface mount device) type.

The package main body 82 is formed by stacking the first substrate 69, the second substrate 71, a third substrate 85, and the sealing ring 72. The plurality of mounting terminals 73 are formed at the outer bottom surface of the first substrate 69. The second substrate 71 and the third substrate 85 are each an annular element with a central portion thereof removed, and the sealing ring 72 made, for example, of Kovar is formed at the upper circumferential edge of the second substrate 71.

The second substrate 71 and the third substrate form the cavity 74, which accommodates the vibrator device 65. A recess 86, which accommodates the drive circuit substrate 84, on which the oscillation circuit that excites the vibrator device 65 is mounted, is formed in the third substrate 85. A plurality of IC bonding terminals 87, to which the drive circuit substrate 84 is coupled, are provided on the upper surface of the first substrate 69, which forms the bottom surface of the recess 86. The plurality of element mounting pads 75, which are electrically continuous with the mounting terminals 73 via wiring lines that are not shown but are formed inside the first substrate 69 and the third substrate 85, are provided in predetermined positions on the upper surface of the third substrate 85. The element mounting pads 75 are disposed so as to correspond to the first pad electrode 4, the third pad electrode 7 or the first pad electrode 44, and the third pad electrode 47 when the vibrator device 65 is placed.

The first substrate 69 to the third substrate 85 of the package main body 82 are made, for example, of a ceramic insulating material. Electrodes and terminals provided in the package main body 82 or wiring patterns, intra-layer wiring patterns, or any other wiring patterns that electrically couple the electrodes and terminals to each other are typically formed by performing screen printing in which a metal wiring material, such as tungsten and molybdenum, is printed on a ceramic insulating material, baking the resulting printed material, and plating nickel, gold, or any other element on the resulting baked material.

The drive circuit substrate 84 is bonded via a brazing material or an adhesive to the IC bonding terminals 87 provided at the bottom surface of the recess 86 of the package main body 82. In the present embodiment, the drive circuit substrate 84 is bonded face down to the IC bonding terminals 87 via bumps 88 made, for example, of metal or solder and provided in advance at electrode pads of the drive circuit substrate 84, which are not shown.

The vibrator device 65 is bonded with the electrically conductive adhesive 76 with the first pad electrode 4, the third pad electrode 7 or the first pad electrode 44, the third pad electrode 47 aligned with the element mounting pads 75.

The lid member 68 is bonded onto the second substrate 71 of the package main body 82. The material of the lid member 68 is, for example, 42 alloy, which contains 42% of nickel in iron, or Kovar, which is an alloy of iron, nickel, and cobalt. The lid member 68 is seam-welded to the second substrate 71 via the sealing ring 72, which is formed by die cutting into a frame. The material of the sealing ring 72 is, for example, an iron-nickel alloy.

The cavity 74 formed by the package main body 82 and the lid member 68 forms a space where the vibrator device 65 operates. The cavity 74 is hermetically sealed to form a reduced pressure space or a space filled with an inert gas atmosphere.

According to the configuration described above, the electronic device 81 includes any of the vibrator devices 1, 40, 43, 51, 55, and 61 in the package 83. The vibrator devices 1, 40, 43, 51, 55, and 61 described above are each a vibrator device that excels in oscillation characteristics. The electronic device 81 can therefore be an electronic device including the vibration element 65, which excels in oscillation characteristics.

What is claimed is:

1. A vibrator device comprising:
   a first excitation electrode, a first pad electrode, and a first drawn wiring line that are disposed at one surface of a vibrator element;
   a second excitation electrode, a second pad electrode, and a second drawn wiring line that are disposed at another surface of the vibrator element; and
   a spiral first electrode pattern disposed at the one surface of the vibrator element,
   wherein the first excitation electrode and the second excitation electrode are disposed so as to face each other with the vibrator element therebetween,
   a central end section of the spiral first electrode pattern is electrically coupled to the second drawn wiring line via a through electrode provided in the vibrator element,
   an outer circumferential end section of the spiral first electrode pattern is electrically coupled to the first drawn wiring line,
   the first drawn wiring line is electrically coupled to at least one of the first excitation electrode and the first pad electrode, and
   the second drawn wiring line is electrically coupled to at least one of the second excitation electrode and the second pad electrode.

2. The vibrator device according to claim 1,
   wherein the through electrode is disposed in a central portion of the first electrode pattern, and
   the second drawn wiring line crosses the first electrode pattern in a plan view and extends from the through electrode to a position outside the first electrode pattern.

3. The vibrator device according to claim 1,
   wherein a spiral second electrode pattern is provided at the another surface,
   a central end section of the spiral second electrode pattern is electrically coupled to the first electrode pattern via the through electrode, and
   an outer circumferential end section of the second electrode pattern is electrically coupled to the second drawn wiring line.

4. The vibrator device according to claim 1,
   wherein the spiral first electrode pattern is electrically coupled in parallel to a vibrator section in which the first excitation electrode and the second excitation electrode sandwich the vibrator element.

5. The vibrator device according to claim 1,
   wherein the spiral first electrode pattern is electrically coupled in series to a vibrator section in which the first excitation electrode and the second excitation electrode sandwich the vibrator element.

6. The vibrator device according to claim 1,
wherein the first pad electrode, the spiral first electrode pattern, and the first excitation electrode are arranged in a lengthwise direction of the vibrator element in a following order: the first pad electrode; the spiral first electrode pattern; and the first excitation electrode.

7. The vibrator device according to claim 6,
wherein a center line passes through a center of the vibrator element in a widthwise direction thereof and extends along the lengthwise direction thereof, and
the first excitation electrode is disposed on one side of the center line, and a center of the spiral first electrode pattern is disposed on another side of the center line.

8. The vibrator device according to claim 6,
wherein a center line passes through a center of the vibrator element in the lengthwise direction thereof and extends along a widthwise direction thereof, and
the first excitation electrode is disposed on one side of the center line, and a center of the spiral first electrode pattern is disposed on another side of the center line.

9. The vibrator device according to claim 1,
wherein the vibrator element in a first area where the first excitation electrode and the second excitation electrode are provided is thinner than the vibrator element in a second area where the first pad electrode and the second pad electrode are provided.

10. A vibrator comprising:
the vibrator device according to claim 1; and
a package in which the vibrator device is incorporated.

11. An electronic device comprising:
the vibrator device according to claim 1;
a package in which the vibrator device is incorporated; and
a drive circuit substrate that supplies the first excitation electrode and the second excitation electrode with a drive voltage.

* * * * *